(12) United States Patent
Lin et al.

(10) Patent No.: US 7,135,406 B2
(45) Date of Patent: Nov. 14, 2006

(54) METHOD FOR DAMASCENE FORMATION USING PLUG MATERIALS HAVING VARIED ETCHING RATES

(75) Inventors: Jian-Hong Lin, Huwei (TW); Ying-Jen Kao, Taipei (TW); Jye-Yen Cheng, Taichung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 10/983,681

(22) Filed: Nov. 9, 2004

(65) Prior Publication Data

US 2006/0099787 A1    May 11, 2006

(51) Int. Cl.
*H01L 21/44* (2006.01)
*H01L 21/4763* (2006.01)

(52) U.S. Cl. ............. 438/675; 438/672; 438/629
(58) Field of Classification Search ........... 438/675, 438/672, 629, 631, 637, 641, 430; 257/E21.585, 257/E21.586, E21.578, E21.577, E21.576, 257/E21.575
See application file for complete search history.

(56) References Cited

U.S. PATENT DOCUMENTS 6,488,509 B1 *  12/2002  Ho et al. ............... 438/629

* cited by examiner

*Primary Examiner*—Walter Lindsay, Jr.
(74) *Attorney, Agent, or Firm*—Birch, Stewart, Kolasch & Birch, LLP

(57) ABSTRACT

Methods for forming openings in damascene structures, such as dual damascene structures are provided, using plug materials having varied etching rates. In one embodiment, a semiconductor substrate is provided with a low-k material layer formed thereabove, the low-k material layer having an upper surface and at least one via opening formed therethrough. A first plug material layer is formed over the low-k material layer and filled in the via opening, the first plug material layer having a first etching rate. The first plug material layer is etched back to form a first plug partially filling the via opening. A second plug material layer is formed over the low-k material layer and the first plug. The second plug material layer is etched back to form a second plug partially below the upper surface of the low-k material layer, the second plug material layer having a second etching rate higher than the first etching rate.

28 Claims, 4 Drawing Sheets

METHOD FOR DAMASCENE FORMATION USING PLUG MATERIALS HAVING VARIED ETCHING RATES

BACKGROUND

The present invention relates generally to the formation of integrated circuit structures, and particularly, but not by way of limitation, to methods for forming openings in damascene structures. More particularly, the present invention relates to methods for forming openings in dual damascene structures using plug materials having varied etching rates.

As semiconductor wafers continually progress to higher density chips with shrinking geometries of 0.13 µm and below, the materials and processes used in wafer fabrication are undergoing dramatic changes. There is a concurrent scaling of all device features to maintain electrical performance. This trend is made possible by the development of new manufacturing techniques as well as innovative improvements of existing procedures thereby extending their utility further towards miniaturization and higher density. One area where the limits of technology are constantly tested is the formation of via, trench, and contact openings in low-k material or dielectric layers on semiconductor substrates and these openings having submicron geometries represent one of the smallest microlithographically defined features on the integrated circuit. These openings pass through the various dielectric layers and are filled with conductive material to form interconnections. One such process for forming interconnections is the ubiquitous dual damascene process.

While dual damascene methods are desirable in semiconductor device fabrication, dual damascene methods are nonetheless not entirely without problems. The type of plug materials used in dual-damascene processes often determine the final trench and via opening profiles. FIG. 1a illustrates a cross-sectional view of a portion of a prior art method of forming a dual damascene structure and where use of a low-etching rate plug material typically produces undesirable trench and via opening profiles. A semiconductor substrate (not shown) is provided with a etch stop layer 10 and a low-k material layer 20 formed thereabove and a plug 30 having a low etching rate is formed in a via opening of the dual damascene structure. A patterned photoresist layer 50 and an anti-reflective coating layer 40 are formed above the plug 30. As shown in FIG. 1b, in the formation of the trench of the dual damascene structure, it is typically observed that an undesirable fence profile 60 is produced as a result of the higher etching rate of low-k material layer 20 with respect to plug 30 such that low-k material layer 20 is etched faster. In forming the trench opening, the trench opening is incompletely etched leaving a fence of unetched material around the via opening and a layer of unetched material overlying the plug 30. As a result, improperly formed dual damascene structures lead to a deterioration of electrical properties, electrical opens, and/or lowering of yield for the semiconductor devices.

FIG. 2a illustrates a cross-sectional view of a portion of a prior art method of forming a dual damascene structure and how use of a high-etching rate plug material produces undesirable trench and via opening profiles. A semiconductor substrate (not shown) is provided with an etch stop layer 10 and a low-k material layer 20 formed thereabove and a plug 30 having a high-etching rate is formed in a via opening of the dual damascene structure. A patterned photoresist layer 50 and an anti-reflective coating layer 40 are formed above the plug 30. As shown in FIG. 2b, undesirable facet profile 70 and etch stop layer break 80 are typically produced as a result of the higher etching rate of plug 30 with respect to low-k material layer 20 such that low-k material layer 20 is etched slower. Dual damascene structures having these fence and facet profiles and etch stop layer breaks exhibit increased RC delay which in turn degrade circuit performance and contribute to low yield for the semiconductor devices.

For these reasons and other reasons that will become apparent upon reading the following detailed description, there is a need for improved methods of forming damascene structures that do not have the fence/facet profiles or etch stop layer breaks that contribute to increased RC delay characteristics and reliability and IC performance problems associated with conventional methods of forming dual damascene structures.

SUMMARY

The present invention is directed to methods for forming openings in damascene structures, such as dual damascene structures, using plug materials having varied etching rates. In one embodiment, a semiconductor substrate is provided with a low-k material layer formed thereabove, the low-k material layer having an upper surface and at least one via opening formed therethrough. A first plug material layer is formed over the low-k material layer and filled in the via opening, the first plug material layer having a first etching rate. The first plug material layer is etched back to form a first plug partially filling the via opening. A second plug material layer is formed over the low-k material layer and the first plug. The second plug material layer is etched back to form a second plug partially below the upper surface of the low-k material layer, the second plug material layer having a second etching rate higher than the first etching rate.

In another embodiment, a semiconductor substrate is provided with an etch stop layer formed thereabove. A low-k material layer is formed above the etch stop layer, the low-k material layer having an upper surface and at least one via opening formed therethrough. A first plug material layer is formed over the low-k material layer and filled in the via opening. The first plug material layer is etched back to form a first plug partially filling the via opening. A second plug material layer is formed over the low-k material layer and the first plug. The second plug material layer is etched back to form a second plug partially below the upper surface of the low-k material layer, the second plug material layer having a higher etching rate than the first plug material layer. A patterned photoresist layer is formed above the low-k material layer, the patterned photoresist layer having a trench pattern. The trench pattern is etched into the low-k material layer and partially in the second plug to form a trench.

BRIEF DESCRIPTION OF THE DRAWINGS

The features, aspects, and advantages of the present invention will become more fully apparent from the following detailed description, appended claims, and accompanying drawings in which:

DETAILED DESCRIPTION

In the following description, numerous specific details are set forth to provide a thorough understanding of the present invention. However, one having an ordinary skill in the art will recognize that the invention can be practiced without these specific details. In some instances, well-known structures and processes have not been described in detail to avoid unnecessarily obscuring the present invention.

Reference will now be made in detail to the present preferred embodiments of the present invention, examples of which are illustrated in the accompanying drawings.

Figure 1A:
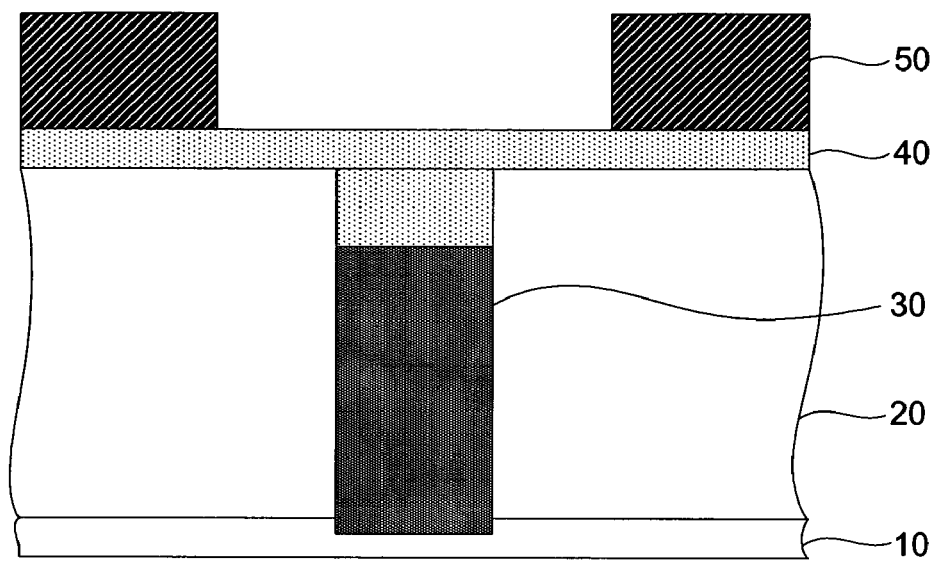
FIGS. 1a–1b are cross-sectional views depicting portions of a prior art method of forming a dual damascene structure.
Figure 1B:
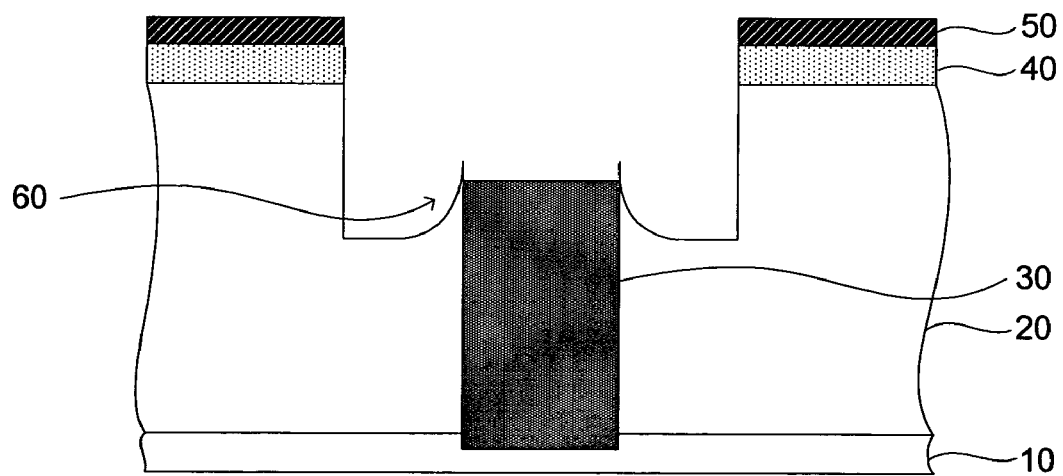
Figure 2A:
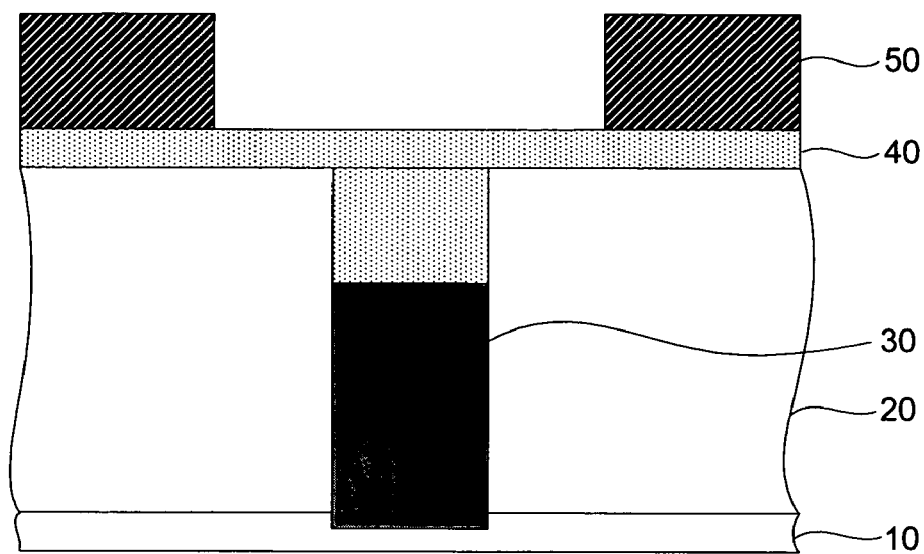
FIGS. 2a–2b are cross-sectional views depicting portions of a prior art method of forming a dual damascene structure.
Figure 2B:
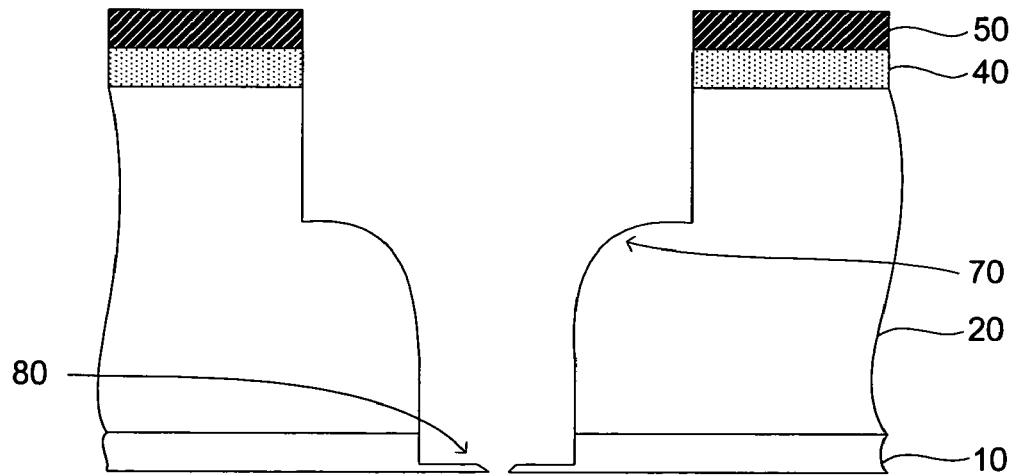
Figure 3:
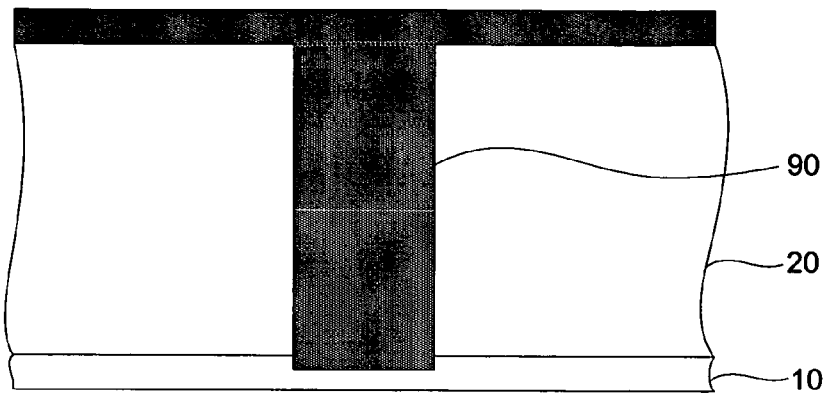
FIG. 3 is a cross-sectional view depicting portions of a formation of a dual damascene structure showing an etch stop layer formed above a substrate, a low-k material layer formed above the etch stop layer, the low-k material layer having an upper surface and a via opening formed therethrough, and a first plug material layer formed over the low-k material layer and filled in the via opening according to one embodiment of the present invention.

FIGS. 3 through 8 illustrate cross-sectional views depicting portions of a formation of an integrated circuit structure, such as for example a dual damascene structure, according to one embodiment of the present invention. It is understood that the type of the integrated circuit structure is a design choice dependent on the fabrication process being employed. For example, integrated circuit structure may be a metal interconnect structure as employed in the fabrication of metal lines and plugs of integrated circuits. In a preferred embodiment, the integrated circuit structure is a dual damascene structure. As depicted in FIG. 3, the dual damascene structure shows an etch stop layer 10 formed above a substrate (not shown), a low-k material layer 20 formed above the etch stop layer 10, the low-k material layer 20 having an upper surface and a via opening formed therethrough, and a first plug material 90 formed over the low-k material layer 20 and filled in the via opening according to one embodiment of the present invention.

The substrate (not shown) may include a substrate as employed within the semiconductor fabrication, wherein the substrate has formed thereupon and/or thereover any of several additional microelectronic layers as are conventionally employed within the semiconductor fabrication. These layers may include, for example, conductor materials, semiconductor materials and dielectric materials. It is understood that the type of the substrate is a design choice dependent on the fabrication process being employed. Typically an etch stop layer 10 is formed above the substrate and is used to control how deep etching occurs for a via opening and/or wench. Etch stop layer 10 is typically formed done by using a barrier layer (e.g. Silicon nitride) as a hard mask at the bottom of the via or trench. Silicon nitride etches at a much slower rate than the dielectric material of the substrate, thus effectively stopping the etch process. Etch stop layer 10 may comprise a material such as, silicon nitride, silicon oxynitride (SiON), or silicon carbide (SiC), have a suitable thickness to function as an etch stop layer, such as a thickness of from about 200 angstroms to about 600 angstroms, and be deposited conformally by a process such as chemical vapor deposition (CVD). Next low-k material layer 20 is deposited on etch stop layer 10. Low-k material layer 20 may include any suitable dielectric material conventionally employed in the manufacture of semiconductor devices, including low-k materials having a dielectric constant of about 3.0 or less to insulate one conductive layer from another. Preferably, low-k material layer 20 includes carbon-doped silicon oxide (SiOC). Carbon-doped silicon oxide is a suitable low k material for use in damascene integration because it exhibits a low dielectric constant of about 2.2 to 2.8, it is structurally more reliable than other low-k materials in microelectronic fabrication, and it cannot be dissolved by hydrofluoric acid (HF) wet etching in a subsequent etching step. Low-k material layer 20 may be deposited by a CVD or spin on methods as are known to those skilled in the art.

An opening that will subsequently be filled by a plug material is formed through low-k material layer 20. It is understood that the opening can be a single damascene opening, a via opening a contact opening, or a trench opening according to design requirements. Preferably, the opening is a via opening. Via opening is formed by any one of several conventional patterning and etching schemes, and maybe formed, for example, by farming a patterned photoresist layer (not shown), preferably a deep ultraviolet (DUV) photoresist over low-k material layer 20 and using an activating radiation source with a wavelength of less than about 250 nm, to expose the photoresist layer. The via opening is anisotropically etched through a thickness of an optional anti-reflective coating (ARC) layer and the low-k material layer 20 to create an opening in closed communication with an underlying conductive region (not shown). The anisotropic etching may typically be carried out by a conventional plasma reactive ion etch (RIE) process.

Subsequent to the formation of the via opening, a first plug material layer 90 is deposited by conventional deposition processes such as spin coating over the low-k material layer 20 and in the via opening. An important aspect of the present invention is that first plug material layer 90 has a lower-etching rate compared to a second or subsequently deposited plug material layer and one objective for the lower-etching rate of first plug material layer 90 is to prevent breakage of etch stop layer 10 during an etching process; another objective which will be explained below is to produce corner rounding profiles at the interface of the trench bottom and via opening top. First plug material layer 90 may comprise a dense and/or hard organic polymer material containing carbon, hydrogen, and oxygen elements, for example. Following the first plug material layer filling process, a baking process may be carried out whereby the first plug material layer 90 is exposed to a high temperature bake. As is known to those skilled in the art, the baking temperature will affect the etching rate of the first plug material layer 90 and a higher baking temperature and/or time Will yield a lower etching rate for the plug material. Therefore, those skilled in the art will know to expose the first plug material layer 90 at what temperature range and for what length of time in order to obtain a certain etching rate. In one embodiment, the first plug material layer 90 is baked to a temperature of from about 150° C. to 250° C. for from about 50 to 150 seconds. In a preferred embodiment, the first plug material layer 90 is baked at a temperature of about 215° C. for about 90 seconds.

Figure 4:
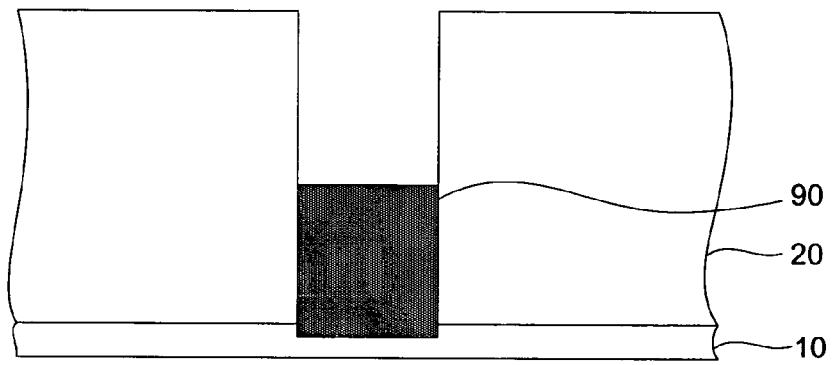
FIG. 4 is a cross-sectional view of the structure of FIG. 3 showing a further step of etching back the first plug material layer to form a first plug partially filling the via opening according to one embodiment of the present invention.

FIG. 4 is a cross-sectional view of the structure of FIG. 3 showing a further step of etching back the first plug material layer 90 to form a first plug partially filling the via opening according to one embodiment of the present invention. The etch back process may be carried out by a conventional dry etch process or a conventional RIE process, with for example an oxygen plasma or a fluorine chemistry such a $CF_4$ and $CHF_3$ with oxygen.

Figure 5:
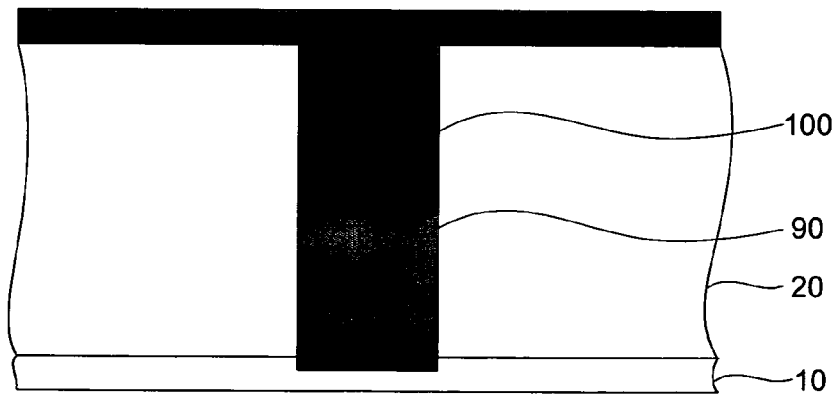
FIG. 5 is a cross-sectional view of the structure of FIG. 4 showing a further step of forming a second plug material layer over the low-k material layer and the first plug according to one embodiment of the present invention.

FIG. 5 is a cross-sectional view of the stricture of FIG. 4 showing a further step of forming a second plug material layer over the low-k material layer 20 and the first plug according to one embodiment of the present invention. Second plug material layer 100 has a higher-etching rate compared to first plug material layer 90. In one embodiment, the etching ratio of first plug material layer 90 to second plug material layer 100 is at least 1 to 1.1. In another embodiment, the etching ratio of first plug material layer to second plug material layer is 1 to 1.1 to 10.0. Second plug material layer 100 may comprise a less dense and/or porous organic polymer material containing carbon, hydrogen, and oxygen elements, for example, compared to first plug material layer 90. Following the second plug material layer filling process, second plug material layer 00 may go through a thermal curing process, where the baking temperature and baking time will affect the etching rate of second plug material layer 100. Those skilled in the art will know the baking temperature and baking time for the second plug material layer 100 to obtain a desired etching rate. In one embodiment, the second plug material layer 100 is baked to a temperature of about 150° C. to 250° C. for from about 50 to 150 seconds. In a preferred embodiment, the second plug material layer 100 is baked at a temperature of about 215° C. for about 90 seconds.

Figure 6:
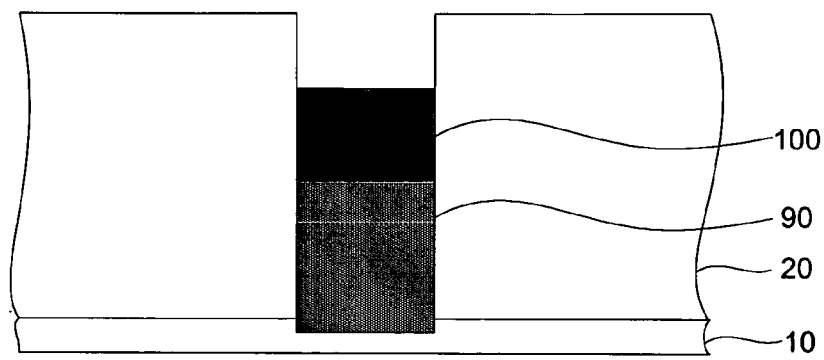
FIG. 6 is a cross-sectional view of the structure of FIG. 5 showing a further step of etching back the second plug material layer to form a second plug partially below the upper surface of the low-k material layer, the second plug material layer having a higher etching rate than the first plug material layer according to one embodiment of the present invention.

Following the baking step, FIG. 6 is a cross-sectional view of the structure of FIG. 5 showing a further step of etching back the second plug material layer 100 to form a second plug partially below the upper surface of the low-k material layer 20 according to one embodiment of the present invention. The etch back process may be carried out by a conventional dry etch process or a conventional RIE process, with for example an oxygen plasma or a fluorine chemistry such a $CF_4$ and $CHF_3$ with oxygen.

Following the etch back process of second plug material layer 100, in another embodiment a third plug material layer (not shown) having yet a higher etching rate than that of the second plug material layer 100 may be deposited over the low-k material layer 20 and the second plug and the whole above processes may be continued to the step of etching back of the third plug material layer to form a third plug. In yet another embodiment, a fourth plug material layer (not shown) having yet a higher etching rate than that of the third plug material layer may be deposited over the low-k material layer 20 and the third plug and the whole above processes may be continued to the etching back of the fourth plug material layer to form a fourth plug. Consequently, the present invention may use two or more plug material layers each of which may have different etching rates with each subsequent plug material layer having higher etching rates than the previous plug material layers.

In yet another embodiment of the present invention, a plug material layer deposited in the via opening and over the low-k material layer 20, may have a gradient etching rate such that the plug material layer has a lower etching rate substantially near the bottom of the via opening going to a higher etching rate substantially near the top thereof.

Figure 7:
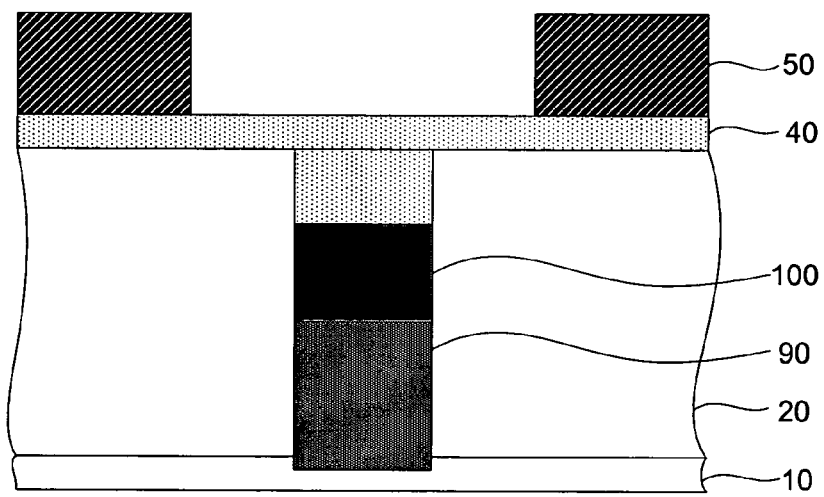
FIG. 7 is a cross-sectional view of the structure of FIG. 6 showing further steps of forming an anti-reflective coating layer over the low-k material layer and the second plug, and forming a patterned photoresist layer above the low-k material layer, the patterned photoresist layer having a trench pattern according to one embodiment of the present invention.
Figure 8:
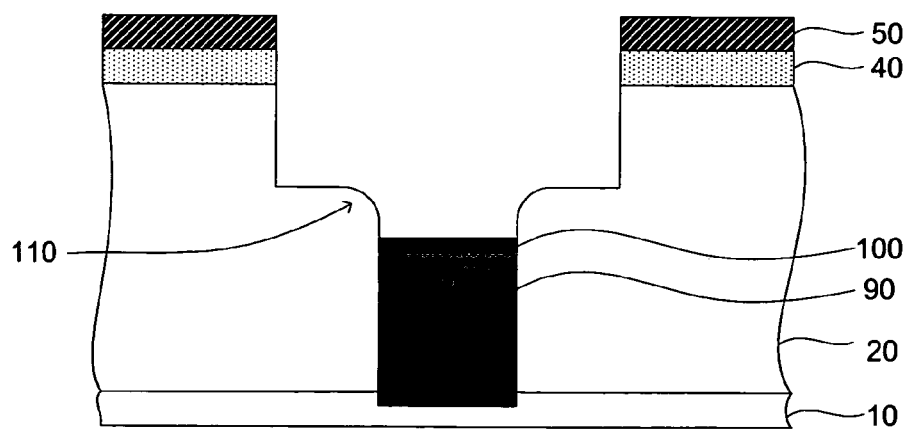
FIG. 8 is a cross-sectional view of the structure of FIG. 7 showing a further step of etching the trench pattern into the low-k material layer and partially in the second plug to form a trench according to one embodiment of the present invention.

With the formation of the via opening of the dual damascene structure, the next processes form the trench of the damascene structure. Shown in FIG. 7 is a cross-sectional view of the structure of FIG. 6 showing further steps of forming an anti-reflective coating layer 40 over the low-k material layer 20 and the second plug, and forming a patterned photoresist layer 50 above the low-k material layer 20, the patterned photoresist layer having a trench pattern according to one embodiment of the present invention. An anti-reflective coating layer 40 may be next deposited over low-k material layer 20 before a photoresist layer to suppress unintended light reflection from a reflective layer that is below the resist. Anti-reflective coating layer 40, preferably comprised of an organic material such as SiON, SiOC or SiN, is deposited by conventional CVD procedures. Anti-reflective coating layer 40 is typically deposited on low-k material layer 20 as a thin layer, typically from around 200 to 2000 angstroms. Anti-reflective coating layer 40 also acts as part of the photoresist mask and along with photoresist layer 50 will be subsequently removed after the completion of the photolithography step. Next, a photoresist layer 50 is deposited by conventional methods such as, for example, spin coating on anti-reflective coating layer 40 at a thickness of from about 1000 angstroms to about 1 μm. The photoresist layer 50 is patterned to define a trench pattern using well-known photolithographic processes, preferably high resolution (less than 0.25) deep UV (DUV) photolithography for optimum pattern resolution. As shown in FIG. 8, the trench pattern is etched by conventional etching processes such as plasma etching into to anti-reflective coating layer 40, the low-k material layer 20, and partially in the second plug 100 to form a trench. In one embodiment, the etching of the trench pattern may include using a selective etching method that has a higher etching rate for the low-k material layer 20 and the anti-reflective coating layer 40 than the second plug material layer 100. It is observed that the use of high-etching rate plug materials (top layer) and low-etching rate plug materials (bottom layer) in dual damascene formation produces desirable corner rounding profile 110 at the via opening/trench interface. Devices with dual damascene structures having corner rounding profiles 100 typically have decreased RC delay and improved circuit performance.

In subsequent processing steps, the patterned photoresist layer 50 and the anti-reflective coating layer 40 are thereafter removed and the partially etched first and second plugs 90 and 100 respectively, are removed from the trench and via opening and the damascene structure is cleaned as necessary. An optional barrier layer may thereafter be formed within the trench and via opening to prevent metal diffusion. A metal layer such as, for example copper is then formed over the low-k material layer and fills the trench and via opening and is then planarized, preferably by chemical mechanical planarization (CMP), to form a planarized dual damascene structure within the trench and via opening.

The present invention provides methods whereby reliable photolithography processes in, for example, a dual damascene process may be reliably carried out without producing damascene structures that exhibit fence/facet profiles or etch stop layer breaks that contribute to increased RC delay characteristics and reliability and IC performance problems associated with conventional methods of forming dual damascene structures. The characteristic of this invention is the utilization of various plug materials' etching characteristics in damascene structures whereby the etching rate of a plug material at the bottom of a via opening is lower than the etching rate of a plug material at the top of the via opening in order to prevent etch stop layer break, fence and facet profiles, and produce desirable corner rounding profiles at the interface of the trench bottom/via opening top, thereby improving circuit performance and contribute to high yield for the semiconductor devices.

In the preceding detailed description, the present invention is described with reference to specifically exemplary embodiments thereof. It will, however, be evident that various modifications, structures, processes, and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A method for forming plugs comprising:
   providing a semiconductor substrate with a low-k material layer formed thereabove, the low-k material layer having an upper surface and at least one via opening formed therethrough; forming a first plug material layer over the low-k material layer and filling the at least one via opening, the first plug material layer having a first etching rate;
   etching back the first plug material layer to form a first plug partially filling the at least one via opening;
   forming a second plug material layer over the low-k material layer and the first plug; and etching back the second plug material layer to form a second plug partially below the upper surface of the low-k material layer, the second plug material layer having a second etching rate.

2. The method of claim 1, wherein the second etching rate is higher than the first etching rate.

3. The method of claim 1, wherein an etching ratio of the first plug material layer to the second plug material layer is at least 1:1.1.

4. The method of claim 1, wherein an etching ratio of the first plug material layer to the second plug material layer is 1:1.1 to 10.0.

5. The method of claim 1, wherein the first plug material layer is made from an organic polymer material.

6. The method of claim 5 further comprising forming a third plug material layer over the low-k material layer and the second plug.

7. The method of claim 6, further comprising etching back the third plug material partially below the upper surface of the low-k material layer, the third plug material layer having a third etching rate.

8. The method of claim 7, wherein the third etching rate is higher than the second etching rate.

9. The method of claim 1, wherein the substrate has an etch stop layer formed thereabove.

10. The method of claim 1, further comprising forming an anti-reflective coating layer over the low-k material layer and the second plug.

11. The method of claim 10, further comprising forming a patterned photoresist layer above the anti-reflective coating layer, the patterned photoresist layer having a trench pattern.

12. The method of claim 10, further comprising etching the trench pattern into the low-k material layer, the anti-reflective coating layer, and partially in the second plug to form a trench.

13. The method of claim 1, wherein the second plug material layer is made from an organic polymer material.

14. The method of claim 1, wherein the first plug material layer is baked at a temperature of from about 150° C. to 250° C. for from about 50 to 150 seconds.

15. The method of claim 1, wherein the second plug material layer is baked at a temperature of from about 150° C. to 250° C. for from about 50 to 150 seconds.

16. The method of claim 1, wherein performing the etching back process to form a first plug includes using a dry etching method.

17. The method of claim 1, wherein performing the etching back process to form a second plug includes using a dry etching method.

18. A method for forming a plug comprising:
    providing a semiconductor substrate with a low-k material layer formed thereabove, the low-k material layer having an upper surface and at least one via opening formed therethrough;
    forming a plug material layer in the at least one via opening and over the low-k material layer, the plug material layer having a gradient etching rate such that the plug material layer has a lower etching rate substantially near the bottom of the via opening going to a higher etching rate substantially near the top thereof; and
    etching back the plug material layer to form a plug partially below the upper surface of the low-k material layer.

19. A method of fabricating a dual damascene structure, comprising:
    providing a semiconductor substrate with an etch stop layer formed thereabove;
    forming a low-k material layer above the etch stop layer, the low-k material layer having an upper surface and at least one via opening formed therethrough;
    forming a first plug material layer over the low-k material layer and filling the at least one via opening;
    etching back the first plug material layer to form a first plug partially filling the at least one via opening;
    forming a second plug material layer over the low-k material layer and the first plug;
    etching back the second plug material layer to form a second plug partially below the upper surface of the low-k material layer, the second plug material layer having a higher etching rate than the first plug material layer;
    forming a patterned photoresist layer above the low-k material layer, the patterned photoresist layer having a trench pattern; and
    etching the trench pattern into the low-k material layer and partially in the second plug to form a trench.

20. The method of claim 19, wherein an etching ratio of the first plug material layer to the second plug material layer is at least 1:1.1.

21. The method of claim 19, wherein an etching ratio of the first plug material layer to the second plug material layer is 1:1.1 to 10.0.

22. The method of claim 19, wherein the step of etching the trench pattern includes using a selective etching method that has a higher etching rate for the low-k material layer than the second plug material layer.

23. The method of claim 19, wherein performing the etching back process to form a first plug includes using a dry etching method.

24. The method of claim 19, wherein performing the etching back process to form a second plug includes using a dry etching method.

25. The method of claim 19, wherein the first plug material layer is baked at a temperature of from about 150° C. to 250° C. for from about 50 to 150 seconds.

26. The method of claim 19, wherein the second plug material layer is baked at a temperature of from about 150° C. to 250° C. for from about 50 to 150 seconds.

27. The method of claim 19, further comprising forming an anti-reflective coating layer over the low-k material layer and the second plug.

28. A method for improving a photolithographic patterning process, comprising:

providing a semiconductor substrate with a low-k material layer formed thereover, the low-k material layer having an upper surface and at least one via opening formed therethrough;

forming a first plug material layer over the low-k material layer and filling the at least one via opening, the first plug material layer having a first etching rate;

etching back the first plug material layer to form a first plug partially filling the at least one via opening;

forming a second plug material layer over the low-k material layer and the first plug; and etching back the second plug material layer to form a second plug partially below the upper surface of the low-k material layer, the second plug material layer having a second etching rate.

* * * * *